US012604400B2

(12) United States Patent
Sapozhnikov et al.

(10) Patent No.: US 12,604,400 B2
(45) Date of Patent: Apr. 14, 2026

(54) VIA AND PAD ARRANGEMENT FOR PRINTED CIRCUIT BOARD

(71) Applicant: Cisco Technology, Inc., San Jose, CA (US)

(72) Inventors: Mike Sapozhnikov, San Jose, CA (US); David Nozadze, San Jose, CA (US); Joel Richard Goergen, Soulsbyville, CA (US); Wenbin Ma, Shanghai (CN); Upen Reddy Kareti, Union City, CA (US); Weiying Ding, Shanghai (CN)

(73) Assignee: CISCO TECHNOLOGY, INC., San Jose, CA (US)

( * ) Notice: Subject to any disclaimer, the term of this patent is extended or adjusted under 35 U.S.C. 154(b) by 280 days.

(21) Appl. No.: 18/449,817

(22) Filed: Aug. 15, 2023

(65) Prior Publication Data

US 2025/0063658 A1 Feb. 20, 2025

(51) Int. Cl.
  *H05K 1/11* (2006.01)
  *H05K 1/02* (2006.01)
  *H05K 3/40* (2006.01)
(52) U.S. Cl.
  CPC .......... *H05K 1/113* (2013.01); *H05K 1/0218* (2013.01); *H05K 3/4038* (2013.01); *H05K 2201/09481* (2013.01)

(58) Field of Classification Search
  CPC .... H05K 1/113; H05K 1/0218; H05K 3/4038; H05K 2201/09481
  USPC ......................................................... 174/262
  See application file for complete search history.

(56) References Cited

U.S. PATENT DOCUMENTS

| | | | | |
|---|---|---|---|---|
| 5,784,262 A | * | 7/1998 | Sherman | .............. H05K 3/3436 361/767 |
| 6,534,872 B1 | | 3/2003 | Freda et al. | |
| 10,455,707 B1 | | 10/2019 | Kiplinger et al. | |
| 2014/0078683 A1 | * | 3/2014 | Moran | ............... H01R 13/7197 361/728 |
| 2014/0209370 A1 | | 7/2014 | Minich | |
| 2015/0223335 A1 | | 8/2015 | Liao et al. | |
| 2015/0319860 A1 | | 11/2015 | Corisis et al. | |
| 2016/0254088 A1 | * | 9/2016 | Kneller | ................... H01F 27/29 361/268 |
| 2023/0328873 A1 | * | 10/2023 | Hui Chen | ............ H05K 1/0218 |

* cited by examiner

*Primary Examiner* — Andargie M Aychillhum
(74) *Attorney, Agent, or Firm* — Edell, Shapiro & Finnan, LLC

(57) ABSTRACT

In some embodiments, an apparatus, includes a pad of a printed circuit board (PCB) configured to couple to an electrical component separate from the PCB and a via formed through the pad. The via is offset from a center of the pad such that a distance between the via and a most adjacent trace electrically separate from the via is above a threshold distance.

20 Claims, 8 Drawing Sheets

452

ROUTE A TRACE ALONG A LAYER OF A PCB

454

POSITION A PAD ON A SURFACE OF A PCB

456

FORM A VIA THROUGH THE PAD AND OFFSET FROM A CENTER OF THE PAD TO POSITION THE VIA ABOVE A THRESHOLD DISTANCE AWAY FROM THE TRACE

450

502

ROUTE TRACES ALONG LAYERS OF A PCB

504

FORM VIAS THROUGH THE LAYERS OF THE PCB

506

ARRANGE DIELECTRIC MATERIAL ON THE PCB SUCH THAT A DIELECTRIC CONSTANT BETWEEN THE TRACES AND/OR BETWEEN THE TRACES AND VIAS IS DIFFERENT THAN A SURROUNDING DIELECTRIC CONSTANT AT A REMAINDER OF THE PCB

500

VIA AND PAD ARRANGEMENT FOR PRINTED CIRCUIT BOARD

TECHNICAL FIELD

The present disclosure relates to printed circuit boards (PCBs) and an arrangement of vias and pads of PCBs.

BACKGROUND

A printed circuit board (PCB) electrically couples various components with one another. For example, a PCB may include multiple layers, each having different components. Additionally, the PCB may include vias that electrically couple components of different layers. For example, a via may extend through multiple layers, and traces may be routed to electrically couple the via to a component at each layer. A signal may propagate along the via and the traces to enable components of different layers to communicate with one another. The PCB may further include pads that are used to electrically couple the PCB and its components with an electrical component (e.g., an integrated circuit) that is separate from the PCB. A via may be formed through or otherwise integrated with a pad to reduce an overall amount of space occupied by the via and the pad and to increase component density of the PCB, such as compared to an arrangement in which the via and the pad are separate from one another. However, the arrangement of vias, which may be at least partially dependent on the positioning of the pads, may affect signal propagation, such as by causing crosstalk between traces and/or between a via and a trace. The crosstalk may reduce signal integrity and negatively impact operation of the PCB.

DETAILED DESCRIPTION

Overview

Techniques are provided herein for arranging vias and pads for a printed circuit board (PCB). In one example embodiment, the techniques described herein relate to an apparatus, including: a pad of a printed circuit board (PCB) configured to couple to an electrical component separate from the PCB; and a via formed through the pad, wherein the via is offset from a center of the pad such that a distance between the via and a most adjacent trace electrically separate from the via is above a threshold distance.

In another example embodiment, the techniques described herein relate to an apparatus, including: a pad of a printed circuit board (PCB), wherein the pad is configured to couple to an electrical component separate from the PCB; a trace configured to propagate a signal; and a via formed through the pad, wherein the via is electrically separate from the trace, and the via is offset from a center of the pad such that crosstalk associated with the trace is below a threshold level.

In yet another example embodiment, the techniques described herein relate to a method, including: positioning a pad on a surface of a printed circuit board (PCB); and forming a via through the pad at a position offset from a center of the pad such that a distance between the via and a most adjacent trace electrically separate from the via is above a threshold distance to limit crosstalk associated with the most adjacent trace below a threshold level.

Figure 1:
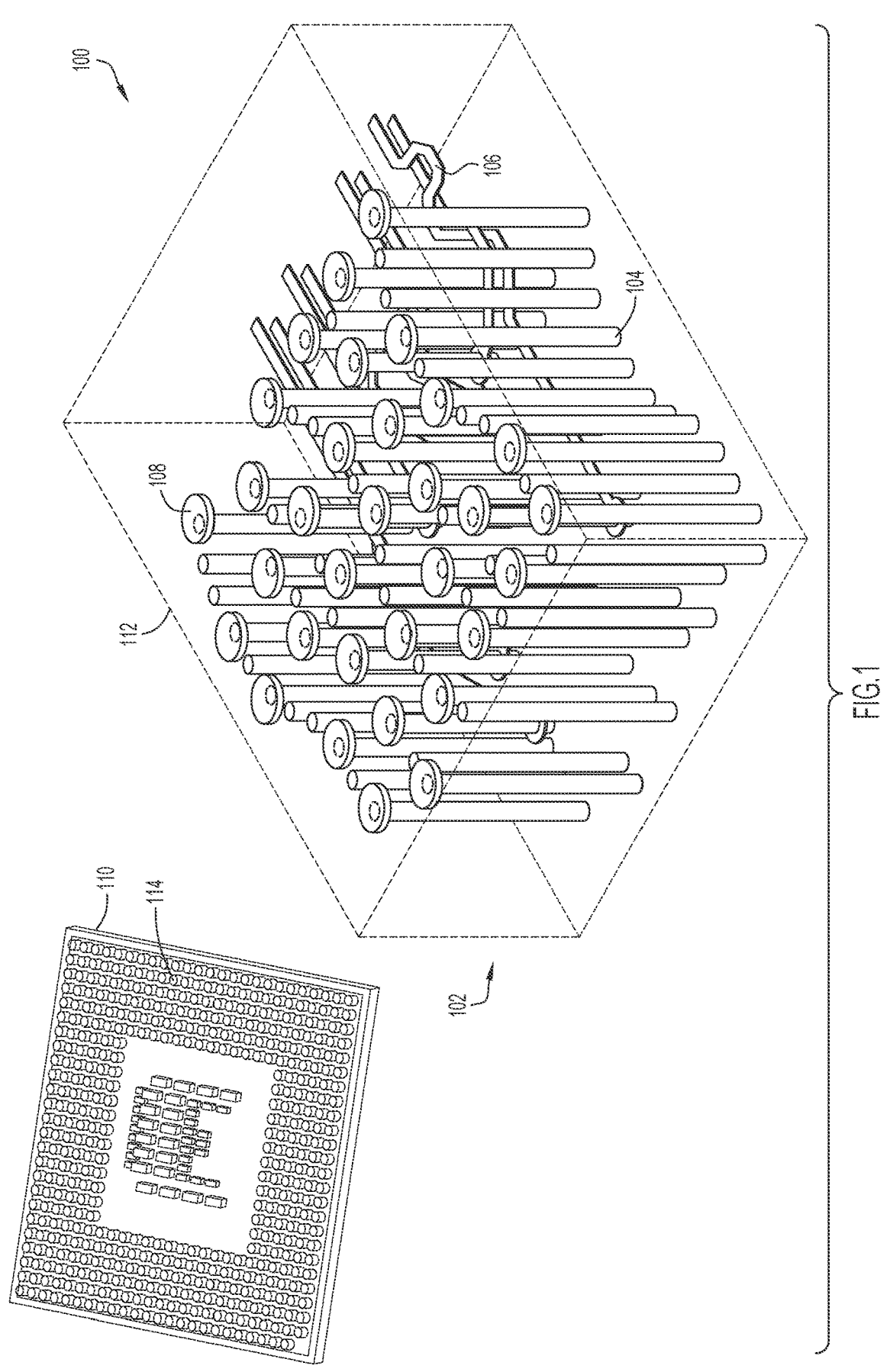
FIG. 1 is a perspective view of a PCB with vias and pads, according to an example embodiment.

With reference made to FIG. 1, depicted therein is a perspective view of a PCB 100 and a separate electrical component 110 configured to electrically couple to PCB 100. The PCB 100 includes multiple layers 102. At least some of the layers 102 (e.g., a top layer, a bottom layer) may include different components, such as resistors, transistors, capacitors, switches, inductors, transformers, sensors, diodes, relays, and so forth. The PCB 100 additionally includes vias 104 that may extend through the layers 102 and electrically couple components of different layers 102 to one another. For example, traces 106 may be routed along the respective layers 102 and connected to the vias 104 and the components, thereby electrically coupling the vias 104 and components to one another. As such, a signal (e.g., an electrical signal) may propagate along the traces 106 and the vias 104 to components of different layers 102.

The PCB 100 may also include pads 108 used to electrically couple the PCB 100 to the electrical component 110. To this end, the pads 108 may be formed on a surface of a first layer 112 of the PCB 100 to expose the pads 108 to an exterior environment surrounding the PCB 100. The electrical component 110 may include mounts 114 (e.g., solder balls) configured to couple to the pads 108, such as by melting the mounts 114 and/or the pads 108, to electrically couple the electrical component 110 and the PCB 100 to one another. For instance, a signal may propagate between the electrical component 110 and the PCB 100 by way of the mounts 114 and the pads 108.

Certain vias 104 may be formed through or integrated with the pads 108. As an example, a hole may be drilled through the pads 108 and through the layers 102, and the hole may be filled and plated with a conductive material along which a signal may be transmitted. The integration of the vias 104 with the pads 108 may reduce a space occupied by the vias 104 and the pads 108. That is, the space occupied by integrated vias 104 and pads 108 is less than a space occupied by vias and pads that are positioned apart or separate from one another. Thus, the volume of the PCB 100 may be more efficiently utilized to position the components of the PCB 100 more densely. However, the positioning of components more closely to one another may increase susceptibility to crosstalk. By way of example, the traces 106 and/or the vias 104 may emit electrical fields during signal propagation. Overlap between electrical fields may cause crosstalk interference that affects integrity of the propagated signals. Crosstalk may affect sending/generation of signals (e.g., near end crosstalk) and/or receipt of signals (e.g., far end crosstalk) to reduce communication between components of the PCB 100 and corresponding operation of the PCB 100.

To improve operation of the PCB 100, the vias 104 may be arranged in a manner that reduces or mitigates crosstalk (e.g., by reducing overlap between electrical signals), while maintaining desired volume or space efficiency of the vias 104. In some embodiments, certain vias 104 that are integrated with the pads 108 are offset from a center of the corresponding pads 108. Such positioning of the vias 104 may move one of the vias 104 away from a trace 106 that is adjacent to and electrically separate from the via 104 to reduce potential crosstalk with the trace 106. As such, signal integrity associated with the via 104 and/or with the trace 106 is increased. As an example, transmission of a first signal along the via 104 may have reduced impact with respect to transmission of a second signal along the trace 106. Thus, integrity of the first signal and/or of the second signal may be increased to improve communication of signals and corresponding operation of the PCB 100. Additionally, the vias 104 remain integrated with the pads 108 in such embodiments. Thus, the space occupied by the vias 104 and the pads 108 may still be desirable (e.g., efficiently utilized).

It should be noted that, in some embodiments, the pads 108 may be positioned at designated or predetermined locations of the PCB 150. By way of example, the pads 108 may be arranged based on the corresponding positions of the mounts 114 to enable coupling between the PCB 100 and the electrical component 110, such as in a certain pattern and/or at certain distances (e.g., 0.8 millimeters (mm), 0.9 mm, 1 mm) away from one another. In this manner, adjustment of the positioning of the pads 108 may be limited or unavailable. However, the positioning of the vias 104 may be more readily adjustable. For example, the vias 104 may be selectively formed at different positions to reduce crosstalk, such as without having to arrange the vias 104 directly in alignment with the mounts 114 as may be the case with the pads 108.

Figure 2:
FIG. 2 is a schematic diagram of a PCB with pads and vias that are offset from one another, according to an example embodiment.

FIG. 2 is a schematic diagram of a PCB 150 illustrating vias that are integrated with and off-center from pads. For example, the PCB 150 includes first traces 152 (e.g., a differential pair in which one of the first traces 152 propagates a positive signal and another of the first traces 152 propagates a negative signal, or separate single end traces that propagate unrelated signals) routed along a first layer 154 of the PCB 150. The PCB 150 also includes second traces 156 that are routed along a second layer 158, different from the first layer 154, of the PCB 150. The first traces 152 and the second traces 156 may be electrically separate from one another. That is, the first traces 152 and the second traces 156 may not be electrically coupled to one another such that separate signals are transmitted along the first traces 152 and along the second traces 156. The first traces 152 are connected to first signal vias 160, and the second traces 156 are connected to second signal vias 162. The first signal vias 160 are formed through and integrated with first signal pads 164, and the second signal vias 162 are formed through and integrated with second signal pads 166.

The first signal vias 160 are positioned off-center with respect to the first signal pads 164 to reduce crosstalk (e.g., between the first signal vias 160 and the second traces 156). In particular, the first signal vias 160 are moved toward one another along an axis 168. The first signal vias 160 may be positioned between a portion of the second traces 156 along the axis 168. Therefore, offsetting the first signal vias 160 from the center of the first signal pads 164 in directions toward one another may move the first signal vias 160 away from the second traces 156 along the axis 168. The positioning of the first signal vias 160 may establish a distance 170 between the first signal vias 160 and the portion of the second traces 156 along the axis 168 to desirably limit crosstalk. For example, establishing the distance 170 above a threshold distance may reduce the crosstalk below a threshold level to benefit crosstalk performance. To provide an example, maintaining the distance 170 above 0.8 mm, 0.9 mm, or 1 mm may reduce the crosstalk below −45 decibels (dB), −50 dB, or −55 dB. However, the distance 170 established between the first signal vias 160 and the second traces 156 may be based on an implementation of the PCB 150, such as a PCB manufacturability matrix, which may correspondingly depend on a data rate of signal transmission. For example, the distance 170 may be relatively greater for relatively higher data rate transmissions (e.g., 224 gigabytes per second (Gbps)) satisfied using an advanced PCB manufacturability matrix that may otherwise cause increased potential of crosstalk. Similarly, the crosstalk to be reduced may also depend on the implementation of the PCB 150. Indeed, different PCBs may have signal vias that are arranged in different manners (e.g., to establish particular distances) to reduce crosstalk more suitably (e.g., below a particular value).

In addition, the second signal pads 166 may be positioned between (e.g., centered between) the first signal pads 164 along the axis 168. Consequently, offsetting the second signal vias 162 from the center of the second signal pads 166 along the axis 168 may increase its distance from one of the first traces 152, but reduce its distance from the other of the first traces 152. Therefore, positioning the second signal vias 162 off-center on the second signal pads 166 may not reduce an overall amount of crosstalk as a result of the reduced distance between the second signal vias 162 and one of the first traces 152. For this reason, the second signal vias 162 may remain centered on the second signal pads 166. That is, the second signal vias 162 are not offset from a center of the second signal pads 166.

The PCB 150 may also include ground or stitching vias that electrically couple different layers (e.g., the first layer 154, the second layer 158) of the PCB 150 to a ground (e.g., a ground layer). The ground vias may extend adjacent to the traces 152, 156 and to the signal vias 160, 162 to help signal propagation. For example, some of the grounds vias may collectively surround a portion of the traces 152, 156 and/or the signal vias 160, 162 to reduce electric field leakage, thereby isolating the electric fields and reducing potential signal loss. That is, the ground vias may help block a signal from being undesirably emitted off a path of travel (e.g., along the first traces 152 to the first signal vias 160), thereby facilitating propagation of the signal to help improve signal integrity. Additionally, certain ground vias may be positioned or moved to reduce potential crosstalk.

By way of example, some ground vias are also formed through and integrated with corresponding ground pads for electrically coupling with a separate electrical component, and a ground via may be positioned off-center on its ground pad. In the illustrated embodiment, a first ground via 172 is integrated with a first ground pad 174 and is positioned outside at least a portion of the traces 152, 156 and the signal vias 160, 162 (e.g., along the axis 168). The first ground via 172 may be positioned off-center on the first ground pad 174 away from a portion of the traces 152, 156 and/or away from the signal vias 160, 162 along the axis 168. Thus, the first ground via 172 may be moved away to provide more space for reducing crosstalk, but may still be positioned sufficiently close to the traces 152, 156 and/or the signal vias 160, 162 to isolate emitted electrical fields. Therefore, the positioning of the first ground via 172 may provide improved signal integrity. A second ground via 176 may be integrated with a second ground pad 178, which may be positioned between a portion of one of the second traces 156 and one of the first signal vias 160 (e.g., along with the first trace 152 connected to the first signal via 160). Therefore, offsetting the second ground via 176 from the second ground pad 178 along the axis 168 may move the second ground via 176 toward the first signal via 160 or toward the second trace 156 and may not provide significant crosstalk reduction. As such, the second ground via 176 may remain centered on the second ground pad 178. However, in alternative embodiments, the second ground via 176 may be off-center from the second ground pad 178, such as in a direction away from the most adjacent second trace 156 along the axis 168.

The PCB 150 may also include third traces 180 (e.g., routed along the first layer 154) connected to third signal vias 182, which are formed through and integrated with third signal pads 184. The PCB 150 may further include fourth traces 186 (e.g., routed along the second layer 158) connected to fourth signal vias 188, which are formed through and integrated with fourth signal pads 190. In the illustrated embodiment, the fourth signal vias 188 are positioned off-center on the fourth signal pads 190 toward one another along the axis 168. For instance, such positioning of one of the fourth signal vias 188 may move the fourth signal via 188 away from the first ground pad 174 to maintain a desirable distance between the fourth signal via 188 and the first ground via 172 integrated with and off-center from the first ground pad 174. In other words, the fourth signal via 188 is correspondingly positioned off-center on its fourth signal pad 190 in the same direction in which the first ground via 172 is positioned off-center on the first ground pad 174. Similarly, because one of the first signal vias 160 is off-center on its first pad 164 and moved away from a third ground pad 192, a third ground via 194 integrated with the third ground pad 192 may be positioned off-center on its third ground pad 192 to move away from the traces 180, 186 and/or the signal vias 182, 188 while maintaining a desirable distance from the most adjacent first signal via 160 to provide more space for reducing crosstalk. Meanwhile, because the third signal pads 184 may be positioned between a portion of the fourth traces 186 and/or between the fourth signal vias 188 along the axis 168, positioning the third signal vias 182 off-center on their third signal pads 184 may not limit an overall amount of crosstalk. Accordingly, the third signal vias 182 connected to the third signal pads 184 may remain centered within the third signal pads 184.

The PCB 150 may further include a fourth ground via 196 integrated with a fourth ground pad 198. In the illustrated embodiment, the fourth ground via 196 is positioned outside of the traces 152, 156 and the signal vias 160, 162. As such, at least a portion of the traces 152, 156 and signal vias 160, 162 may be positioned between the first ground via 172 and the fourth ground via 198 along the axis 168. The fourth ground via 196 is positioned off-center on the fourth ground via 198 and away from a portion of the traces 152, 156 and/or from the signal vias 160, 162 along the axis 168. In this manner, the first ground via 172 and the fourth ground via 196 are off-center from their respective ground pads 174, 198 in opposite directions away from one another, such as at the same distance 200 away from the second signal vias 162 along the axis 168. Such positioning of the fourth ground via

196 may reduce crosstalk associated with the signals vias 160, 162 and/or with the traces 152, 156. However, in additional or alternative embodiments, the first ground via 172 and the fourth ground via 196 may be offset in different manners, such as in the same direction (e.g., the fourth ground via 196 may be off-center from the fourth ground pad 198 in a direction along the axis 168 toward the first signal pads 164 and away from other signal vias of the PCB 150 to provide more space for reducing crosstalk associated with the other signal vias) and/or at different distances with respect to the second signal vias 162.

Further still, the PCB 150 may include a fifth ground via 202 integrated with a fifth ground pad 204. The fifth ground via 202 may be positioned outside of the traces 180, 186 and the signal vias 182, 188. Thus, the traces 180, 186 and the signal vias 182, 188 may be positioned between the first ground via 172 and the fifth ground via 202 along the axis 168. The fifth ground via 202 is positioned off-center on the fifth ground pad 204 and toward a portion of the traces 180, 186 and/or toward the signal vias 182, 188 along the axis 168. That is, the first ground via 172 and the fifth ground via 202 are off-center from their respective ground pads 174, 204 in opposite directions toward one another along the axis 168. The positioning of the fourth signal vias 188 off-center on the respective fourth signal pads 190 toward one another along the axis 168 may move one of the fourth signal vias 188 away from the first ground pad 174 and the other of the fourth signal vias 188 away from the fifth ground pad 204. For example, the off-center positioning of the fourth signal vias 188 may maintain a distance 206 between the first signal via 172 connected to the first ground pad 174 and one of the fourth signal vias 188 and between the fifth signal via 202 connected to the fifth ground pad 204 and the other of the fourth signal vias 188 to provide more space for reducing crosstalk. However, in additional or alternative embodiments, the first ground via 172 and the fifth ground via 202 may be offset in the same direction and/or are positioned at different distances away from the fourth signal vias 188.

Although the present disclosure primarily discusses positioning vias (e.g., signal vias, ground vias) off-center on their respective pads along the axis 168, in additional or alternative embodiments, any of the vias may be positioned off-center on its pad along a different direction, such as along an axis oriented crosswise (e.g., perpendicularly) to the axis 168. Moreover, it should be noted that other components of the PCB 150 may also be moved to reduce crosstalk. As an example, ground vias that are not integrated with a ground pad may be moved, and/or routing of any of the traces 152, 156, 180, 186 may be adjusted (e.g., moved in a corresponding direction with respect to off-centered ground vias). The particular arrangements of components being implemented may be based on certain parameters specific to the PCB 150, such as a data rate transmission, a quantity/size of components, a positioning of components (e.g., of ground vias with respect to traces), and/or a manufacturability.

Figure 3:
FIG. 3 is a perspective view of a PCB with pads and vias that are offset from one another, according to an example embodiment.

FIG. 3 is a perspective view of an embodiment of the PCB 150. Certain components of the PCB 150, such as the layers 154, 158, are not shown for visualization purposes. As shown, the first traces 152 are connected to the first signal vias 160, the second traces 156 are connected to the second signal vias 162, the third traces 180 are connected to the third signal vias 182, and the fourth traces 186 are connected to the fourth signal vias 188. In the illustrated embodiment, the first traces 152 and the second traces 156 extend along different layers of the PCB 150, and a portion of each first trace 152 extends along (e.g., above) a portion of one of the second traces 156 (i.e., a portion of the first traces 152 overlap with a portion of the second traces 156). Similarly, the third trace s 180 and the fourth traces 186 extend along different layers, and a portion of each third trace 180 extends along a portion of one of the fourth traces 186 (i.e., a portion of the third traces 180 overlap with a portion of the fourth traces 186). Additionally, the first signal vias 160 are off-center from but contained within the first signal pads 164, and the fourth signal vias 188 are off-center from but contained within the fourth signal pads 190. That is, the signal vias 160, 188 do not extend beyond an outer boundary or perimeter (e.g., a circumference) of the corresponding signal pads 164, 190. Similarly, various ground vias 250 are integrated with ground pads 252 and are off-center from but contained within the ground pads 252. For example, each pad 164, 190, 252 includes a circular shape, and the vias 160, 188, 250 are positioned eccentrically with respect to the corresponding pads 164, 190, 252. As such, a breakout of the vias 160, 188, 250 in which the vias 160, 188, 250 extend beyond the outer boundary of the pads 164, 190, 252 is avoided to avoid incomplete electrical connections and/or improper mounting issues that otherwise may occur.

Because the traces 152, 156, 180, 186 are generally routed to maintain a desirable distance away from certain vias 160, 188, 250, the off-center positioning of the vias 160, 188, 250 on the pads 164, 190, 252 may provide space that enables greater flexibility to position the traces 152, 156, 180, 186 and maintains the desirable distance between the traces 152, 156, 180, 186. For example, by moving one of the ground vias 250 and one of the first signal vias 160 away from one another, there may be a greater amount of available routes or positionings of one of the second traces 156 between the ground via 250 and the first signal via 160 that maintains a desirable distance between the second trace 156 and the ground via 250. That is, a tolerance or flexibility to route the traces 152, 156, 180, 186 may be increased. As a result, the off-center positioning of the vias 160, 188, 250 on the pads 164, 190, 252 may improve an case of manufacture of the PCB 150 to route the traces 152, 156, 180, 186.

Figure 4:
FIG. 4 is a schematic diagram of a PCB with dielectric material positioned between vias and traces, according to an example embodiment.

FIG. 4 is a schematic diagram of the PCB 150. The PCB 150 may have a dielectric material 300 (e.g., resin) positioned between one of the second traces 156 and various vias (e.g., along the layer at which the second traces 156 are routed), such as an adjacent first signal via 160, an adjacent second signal via 162, and/or adjacent ground vias 250. The dielectric material 300 may further help with signal propagation. For example, the dielectric material 300 may have a relatively low dielectric constant (e.g., with respect to that of dielectric material positioned elsewhere on the PCB 150) that is below a threshold value to reduce crosstalk associated with the second trace 156. The relatively low dielectric constant may reduce dispersion of signal propagated along the second trace 156, thereby reducing possibility of the signal being emitted onto the first traces 152 and/or onto the first signal vias 160, for instance. In some embodiments, the dielectric constant of the dielectric material may be less than 4, between 4 and 4.4, between 4.5 and 5, and so forth.

Figure 5:
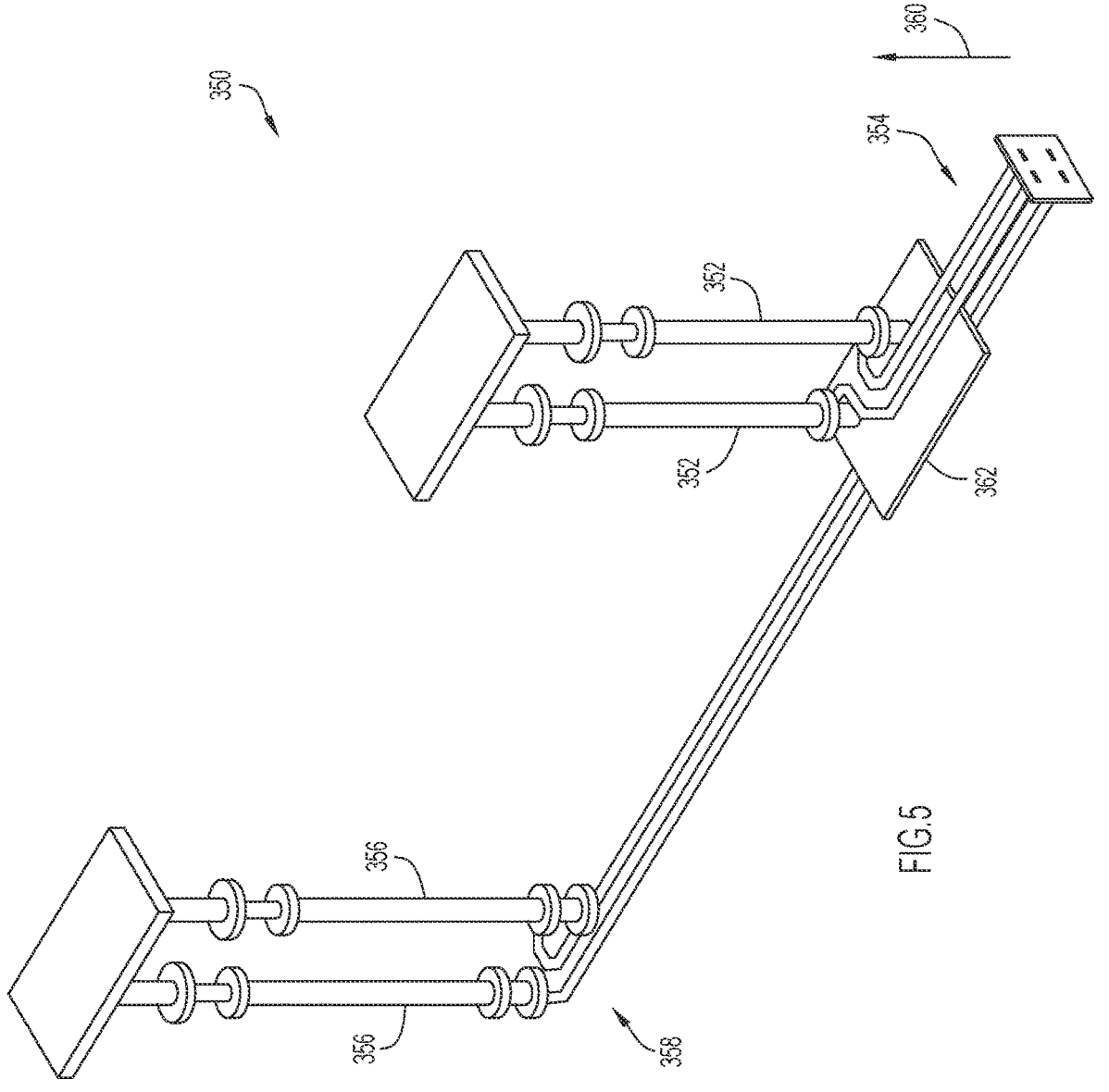
FIG. 5 is a perspective view of a PCB with dielectric material positioned between traces, according to an example embodiment.

FIG. 5 is a perspective view of a PCB 350 (e.g., a portion of the PCB 150). The PCB 350 may include first traces 352 (e.g., a differential pair configured to receive first signals), which may be routed along a first layer 354, and second traces 356 (e.g., a differential pair configured to receive second signals, separate from the first signals), which may be routed along a second layer 358. As such, the first traces 352 and the second traces 356 may be offset from one another along an axis 360. A dielectric material 362 may be positioned between the traces 352, 356 along the axis 360. The dielectric material 362 may have a relatively low dielectric constant to reduce crosstalk between the traces 352, 356. As such, dielectric material may be selectively positioned between traces, as shown in FIG. 5, and/or between traces and vias, as shown in FIG. 4, to reduce crosstalk.

Figure 6:
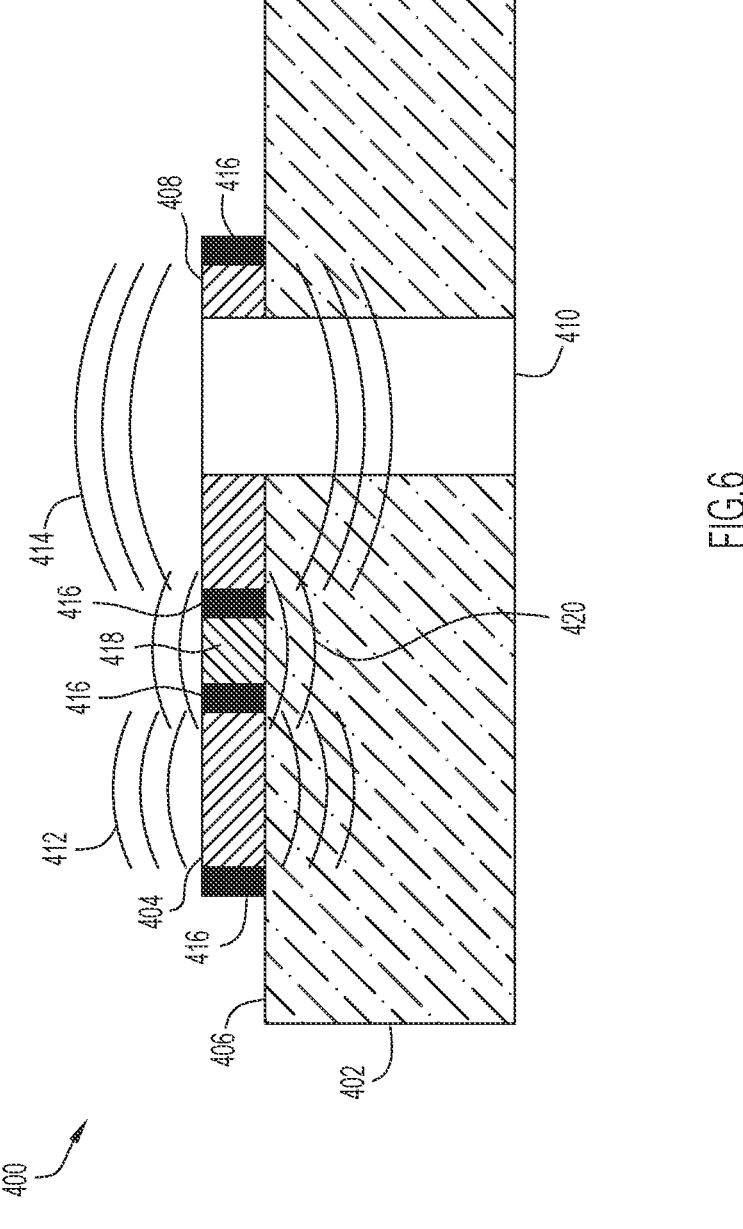
FIG. 6 is a cross-sectional side view of a PCB with dielectric material positioned between a via and a trace, according to an example embodiment.

FIG. 6 is a cross-sectional side view of a PCB 400 (e.g., a portion of the PCB 150). The PCB 400 includes a layer 402 (e.g., a core), a trace 404 positioned on a surface 406 of the layer 402, a pad 408 positioned on the surface 406, and a via 410 integrated with (e.g., and off-center from) the pad 408. The trace 404 may be offset from (e.g., positioned away from) the via 410, and the trace 404 and the via 410 may be configured to communicate with one another via induction. That is, the trace 404 may transmit a signal to the via 410 by outputting first electric fields 412 that may be captured by the via 410. Similarly, the via 410 may transmit a signal to the trace 404 by outputting second electric fields 414 that may be captured by the trace 404. Thus, the trace 404 and the via 410 may communicate with one another without being directly in contact with one another.

Dielectric material may be implemented in the PCB 400 to reduce crosstalk without limiting inductive coupling between the trace 404 and the via 410. For example, first dielectric material 416 (e.g., inductive dielectric material) may be attached to the trace 404 and to the pad 408. Second dielectric material 418 (e.g., filler dielectric material) may be inserted between the first dielectric material 416 positioned between the trace 404 and the pad 408. The first dielectric material 416 may have a relatively higher dielectric constant, and the second dielectric material 418 may have a relatively lower dielectric constant. The relatively higher dielectric constant of the first dielectric material 416 may help maintain inductive coupling between the trace 404 and the via 410, whereas the relatively lower dielectric constant of the second dielectric material 418 may limit crosstalk associated with the trace 404 and/or with the via 410 with other traces and/or vias. For example, the arrangement of the first dielectric material 416 and the second dielectric material 418 may result in output of third electric fields 420. The third electric fields 420 may help with signal transmission from the trace 404 to the via 410 and/or from the via 410 to the trace 404. For instance, the third electric fields 420 may overlap with the first electric fields 412 output by the trace 404 and/or with the second electric fields 414 output by the via 410. Moreover, the second dielectric material 418 may limit travel of the third electric fields 420, such as away from the trace 404 and/or away from the via 410, to limit potential crosstalk caused by the third electric fields 420. In this manner, first dielectric material 416 and the second dielectric material 418 may help direct a signal output by the trace 404 toward the via 410 by way of the first electric fields 412 and the third electric fields 420 (e.g., and limit travel away from the via 410) and/or help direct a signal output by the via 410 toward the trace 404 by way of the second electric fields 414 and the third electric fields 420 (e.g., and limit travel away from the trace 404) to improve the inductive communication between the trace 404 and the via 410, while limiting crosstalk.

Each of FIGS. 7 and 8 discussed below illustrates a method of manufacture of a PCB, such as any of the PCBs 150, 350, 400. In certain embodiments, each method may be performed by a single entity, such as a processor executing instructions stored on a memory. In additional or alternative embodiments, separate entities may perform each method and/or operations within each method. It should be noted that each method may be performed differently than depicted. For example, additional operations may be performed, any of the depicted operations may not be performed, and/or the depicted operations may be performed in a different order.

Figure 7:
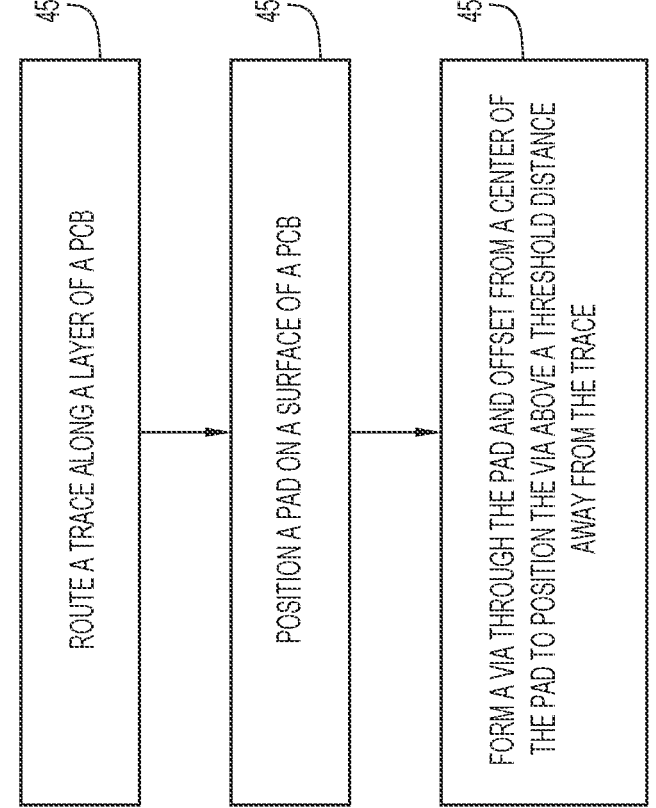
FIG. 7 is a flowchart of a method of manufacture of a PCB having pads and vias that are offset from one another, according to an example embodiment.

FIG. 7 is a flowchart of a method 450 of manufacture of a PCB. At step 452, a trace is routed along a layer of the PCB, such as along a surface of the layer. The trace may be connected to a component at the layer to enable signal propagation to and/or from the component. At step 454, a pad is positioned on a surface of the PCB, such as on the same layer as that of the trace and/or on a separate layer. The positioning of the pad may expose the pad to an exterior environment to enable access to the pad for coupling to an electrical component separate from the PCB. As discussed herein, the pads may be positioned at a particular location, such as for alignment with mounts of the electrical component to which the PCB is to be coupled. The pad may be electrically separate from the trace. That is, a signal transmitted along the trace may not be transmitted along the pad.

At step 456, a via is formed through the pad and is offset from a center of the pad. Such formation of the via integrates the via with the pad and positions the via above a threshold distance away from the trace, which may be electrically separate from the via. Consequently, emission of a signal transmitted along the trace onto the via may be limited. Similarly, emission of a signal transmitted along the via and onto the trace may be limited. Thus, signal integrity associated with the trace and/or with the via may be maintained to improve signal transmission and corresponding operation of the PCB.

In some embodiments, the via being formed may be a ground via. Thus, no other traces may be connected to the via. Alternatively, the via being formed may be a signal via. Thus, the via may be configured to propagate a signal. For example, the via may be connected to another trace. Additionally, the trace that is electrically separate from the via may be connected to a separate via, which may be formed through an additional pad (e.g., positioned on the surface of the PCB). The separate via may be centered on the additional pad or may be off-center from the additional pad.

Although the method 450 depicts the via as being formed through the pad, such that the pad is initially positioned and the via is formed thereafter, in additional or alternative embodiments, the via may be formed and the pad is subsequently positioned. For example, a hole is initially drilled into the PCB (e.g., through the surface) and filled with conductive material to form the via, and the pad may then be positioned about the formed via. In either case, the via is positioned off-center on the pad to position the via above the threshold distance away from the trace, and the via is contained within the boundary or perimeter of the trace to avoid a breakout of the via.

Figure 8:
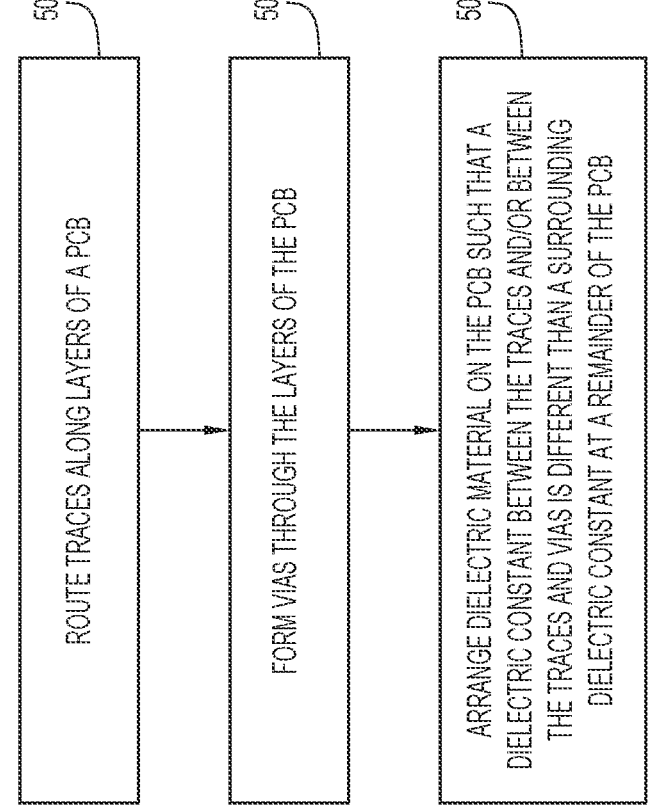
FIG. 8 is a flowchart of a method of manufacture of a PCB having dielectric material, according to an example embodiment.

FIG. 8 is a flowchart of a method 500 of manufacture of a PCB. At step 502, traces are routed along respective layers of the PCB. For example, the traces may be connected to electrical components to enable signal propagation. At step 504, vias are formed through the layers of the PCB. For instance, the vias are connected to traces of different layers, thereby electrically coupling the traces, as well as electrical components coupled to the traces, of different layers to one another.

At step 506, dielectric material is arranged on the PCB such that a dielectric constant of the dielectric material between (e.g., in contact with) the traces and/or between the traces and vias is different than a surrounding dielectric constant at a remainder of the PCB (e.g., arranged outside of the trace routing and/or positioned farther away from the traces and vias). For example, the difference between the dielectric constants is above a threshold value. In some embodiments, the dielectric constant of the dielectric material between the traces and/or between the traces and vias may be relatively lower to reduce crosstalk. In additional or alternative embodiments, the dielectric constant at certain parts of the dielectric material between the traces and/or between the traces and vias may be relatively greater to facilitate inductive communication, whereas the dielectric constant of the dielectric material at other parts between the traces and/or between the traces and vias may be relatively smaller to reduce crosstalk. For example, such arrangements of the dielectric material may direct signals in certain directions to facilitate inductive communication and to reduce crosstalk.

In certain embodiments, separate dielectric materials may be arranged to provide the different dielectric constants. For example, a first dielectric material (e.g., a primary dielectric material) includes the surrounding dielectric constant and is implemented at certain areas of the PCB, and a second dielectric material (e.g., a secondary dielectric material) having the different dielectric constant is specifically positioned between the traces and/or between the traces and vias. In such embodiments, the dielectric materials may be separately implemented (e.g., sequentially, one after another) or may be implemented simultaneously (e.g., by coupling the dielectric materials to form a more integrated component). Additionally or alternatively, a dielectric material having different dielectric constants may be implemented. That is, a single, monolithic dielectric material may have first portions with the different dielectric constant configured to be positioned between the traces and/or between the traces and vias, as well as second portions with the surrounding dielectric constant configured to be implemented at a remainder of the PCB. In any of these embodiments, the different dielectric constants at different parts of the PCB may facilitate signal propagation, such as by limiting crosstalk.

Additional operations may also be performed to reduce crosstalk. For instance, extension of a via through layers of the PCB may be limited to reduce potential signal emission from portions of the via that are not used for communication. As an example, a portion of the via may not be connected to any trace. Thus, the portion of the via may be removed to avoid signal emission from the portion of the via. In some embodiments, the portion of the via may be removed by drilling (e.g., backdrilling) the PCB through the hole in which the via is positioned to remove the conductive material of the via that is not used for transmitting a signal. Such an operation may reduce crosstalk between layers of the PCB through which the via may have previously extended.

The via, trace, and pad positioning techniques described herein may reduce crosstalk associated with signal transmission. Reducing the crosstalk may improve signal integrity and facilitate communication between components of the PCB, thereby improving operation of the PCB. For example, the techniques include offsetting vias from a center of corresponding pads to position the vias away from adjacent traces. Additionally, dielectric material(s) may be implemented in the PCB, and the dielectric constant of the dielectric material(s) at areas between traces and/or between vias and traces may be different than the dielectric constant of the dielectric material(s) at a remainder of the PCB.

In some aspects, the techniques described herein relate to an apparatus, including: a pad of a printed circuit board (PCB) configured to couple to an electrical component separate from the PCB; and a via formed through the pad, wherein the via is offset from a center of the pad such that a distance between the via and a most adjacent trace electrically separate from the via is above a threshold distance.

In some aspects, the techniques described herein relate to an apparatus, wherein the pad is a first pad and the via is a first via, and the PCB includes: a second pad; and a second via formed through the second pad, wherein the second via is offset from a center of the second pad and the first via is offset from the center of the first pad in opposite directions along an axis.

In some aspects, the techniques described herein relate to an apparatus, including: a third pad positioned between the first pad and the second pad along the axis; a third via formed through the third pad; and the most adjacent trace, wherein the most adjacent trace is connected to the third via.

In some aspects, the techniques described herein relate to an apparatus, wherein the third via is centered on the third pad.

In some aspects, the techniques described herein relate to an apparatus, wherein the second via is offset from the center of the second pad and the first via is offset from the center of the first pad away from one another along the axis.

In some aspects, the techniques described herein relate to an apparatus, wherein the third via is offset from a center of the third pad along the axis.

In some aspects, the techniques described herein relate to an apparatus, wherein the second via is offset from the center of the second pad and the first via is offset from the center of the first pad toward one another along the axis.

In some aspects, the techniques described herein relate to an apparatus, wherein the via is eccentrically positioned within a circumference of the pad.

In some aspects, the techniques described herein relate to an apparatus, wherein the via is a ground via electrically coupled to a ground layer of the PCB and electrically separate from each trace of the PCB.

In some aspects, the techniques described herein relate to an apparatus, including: a pad of a printed circuit board (PCB), wherein the pad is configured to couple to an electrical component separate from the PCB; a trace configured to propagate a signal; and a via formed through the pad, wherein the via is electrically separate from the trace, and the via is offset from a center of the pad such that crosstalk associated with the trace is below a threshold level.

In some aspects, the techniques described herein relate to an apparatus, including an additional trace connected to the via.

In some aspects, the techniques described herein relate to an apparatus, wherein the trace and the additional trace are routed along different layers of the PCB, the PCB includes dielectric material positioned between the trace and the additional trace, and the dielectric material includes a dielectric constant below a threshold value.

In some aspects, the techniques described herein relate to an apparatus, wherein the threshold level is between −45 decibels (dB) and −55 dB.

In some aspects, the techniques described herein relate to an apparatus, including dielectric material positioned between the trace and the via, wherein the dielectric material includes a dielectric constant below a threshold value.

In some aspects, the techniques described herein relate to an apparatus, wherein the threshold value is between 4 and 5.

In some aspects, the techniques described herein relate to a method, including: positioning a pad on a surface of a printed circuit board (PCB); and forming a via through the pad at a position offset from a center of the pad such that a distance between the via and a most adjacent trace electrically separate from the via is above a threshold distance to limit crosstalk associated with the most adjacent trace below a threshold level.

In some aspects, the techniques described herein relate to a method, including: positioning an additional pad on the surface of the PCB; forming an additional via through the pad at a position centered on the additional pad; and connecting the most adjacent trace to the additional via.

In some aspects, the techniques described herein relate to a method, including: routing an additional trace along a layer of the PCB; and connecting the additional trace to the via.

In some aspects, the techniques described herein relate to a method, including positioning dielectric material between the via and the most adjacent trace, wherein the dielectric material includes a dielectric constant below a threshold value.

In some aspects, the techniques described herein relate to a method, including: routing an additional trace along a layer of the PCB, wherein the additional trace is in inductive communication with the via; and positioning dielectric material between the via and the additional trace, wherein the dielectric material includes a dielectric constant above a threshold value. The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X. Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the' (s)' nomenclature (e.g., one or more element(s)).

As used herein, the terms "approximately," "generally," "substantially," and so forth, are intended to convey that the property value being described may be within a relatively small range of the property value, as those of ordinary skill would understand. For example, when a property value is described as being "approximately" equal to (or, for example, "substantially similar" to) a given value, this is intended to convey that the property value may be within +/−5%, within +/−4%, within +/−3%, within +/−2%, within +/−1%, or even closer, of the given value. Similarly, when a given feature is described as being "substantially parallel" to another feature, "generally perpendicular" to another feature, and so forth, this is intended to convey that the given feature is within +/−5%, within +/−4%, within +/−3%, within +/−2%, within +/−1%, or even closer, to having the described nature, such as being parallel to another feature, being perpendicular to another feature, and so forth. Mathematical terms, such as "parallel" and "perpendicular," should not be rigidly interpreted in a strict mathematical sense, but should instead be interpreted as one of ordinary skill in the art would interpret such terms. For example, one of ordinary skill in the art would understand that two lines that are substantially parallel to each other are parallel to a substantial degree, but may have minor deviation from exactly parallel The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus, comprising:
a pad of a printed circuit board (PCB) configured to couple to an electrical component separate from the PCB; and
a via formed through the pad, wherein the via is offset from a center of the pad such that a distance between the via and a most adjacent trace electrically separate from the via is above a threshold distance and crosstalk associated with the most adjacent trace is below a threshold level.

2. The apparatus of claim 1, wherein the pad is a first pad and the via is a first via, and the PCB comprises:
a second pad; and
a second via formed through the second pad, wherein the second via is offset from a center of the second pad and the first via is offset from the center of the first pad in opposite directions along an axis.
3. The apparatus of claim 2, comprising:
a third pad positioned between the first pad and the second pad along the axis;
a third via formed through the third pad; and
the most adjacent trace, wherein the most adjacent trace is connected to the third via.
4. The apparatus of claim 3, wherein the third via is centered on the third pad.
5. The apparatus of claim 4, wherein the second via is offset from the center of the second pad and the first via is offset from the center of the first pad away from one another along the axis.
6. The apparatus of claim 3, wherein the third via is offset from a center of the third pad along the axis.
7. The apparatus of claim 6, wherein the second via is offset from the center of the second pad and the first via is offset from the center of the first pad toward one another along the axis.
8. The apparatus of claim 1, wherein the via is eccentrically positioned within a circumference of the pad.
9. The apparatus of claim 1, wherein the via is a ground via electrically coupled to a ground layer of the PCB and electrically separate from each trace of the PCB.
10. An apparatus, comprising:
a pad of a printed circuit board (PCB), wherein the pad is configured to couple to an electrical component separate from the PCB;
a trace configured to propagate a signal; and
a via formed through the pad, wherein the via is electrically separate from the trace, and the via is offset from a center of the pad such that crosstalk associated with the trace is below a threshold level.
11. The apparatus of claim 10, comprising an additional trace connected to the via.
12. The apparatus of claim 11, wherein the trace and the additional trace are routed along different layers of the PCB, the PCB comprises dielectric material positioned between the trace and the additional trace, and the dielectric material comprises a dielectric constant below a threshold value.
13. The apparatus of claim 10, wherein the threshold level is between−45 decibels (dB) and −55 dB.
14. The apparatus of claim 10, comprising dielectric material positioned between the trace and the via, wherein the dielectric material comprises a dielectric constant below a threshold value.
15. The apparatus of claim 14, wherein the threshold value is between 4 and 5.
16. A method, comprising:
positioning a pad on a surface of a printed circuit board (PCB); and
forming a via through the pad at a position offset from a center of the pad such that a distance between the via and a most adjacent trace electrically separate from the via is above a threshold distance to limit crosstalk associated with the most adjacent trace below a threshold level.
17. The method of claim 16, comprising:
positioning an additional pad on the surface of the PCB;
forming an additional via through the additional pad at a position centered on the additional pad; and
connecting the most adjacent trace to the additional via.

18. The method of claim 16, comprising:

routing an additional trace along a layer of the PCB; and connecting the additional trace to the via.

19. The method of claim 16, comprising positioning dielectric material between the via and the most adjacent trace, wherein the dielectric material comprises a dielectric constant below a threshold value.

20. The method of claim 16, comprising:

routing an additional trace along a layer of the PCB, wherein the additional trace is in inductive communication with the via; and positioning dielectric material between the via and the additional trace, wherein the dielectric material comprises a dielectric constant above a threshold value.

\*    \*    \*    \*    \*